(12) United States Patent
Schafferer et al.

(10) Patent No.: US 9,276,617 B2
(45) Date of Patent: Mar. 1, 2016

(54) RADIO FREQUENCY DOMAIN DIGITAL PRE-DISTORTION

(71) Applicant: ANALOG DEVICES, INC., Norwood, MA (US)

(72) Inventors: Bernd Schafferer, Amesbury, MA (US); Bing Zhao, Andover, MA (US)

(73) Assignee: ANALOG DEVICES, INC., Norwood, TX (US)

( * ) Notice: Subject to any disclaimer, the term of this patent is extended or adjusted under 35 U.S.C. 154(b) by 0 days.

(21) Appl. No.: 14/206,451

(22) Filed: Mar. 12, 2014

(65) Prior Publication Data

US 2014/0269988 A1 Sep. 18, 2014

Related U.S. Application Data

(60) Provisional application No. 61/799,723, filed on Mar. 15, 2013, provisional application No. 61/787,733, filed on Mar. 15, 2013, provisional application No. 61/801,549, filed on Mar. 15, 2013, provisional application No. 61/867,233, filed on Aug. 19, 2013.

(51) Int. Cl.
*H04K 1/02* (2006.01)
*H04L 25/03* (2006.01)
(Continued)

(52) U.S. Cl.
CPC ............... *H04B 1/0475* (2013.01); *H03F 1/30* (2013.01); *H03F 1/3247* (2013.01); *H03F 3/195* (2013.01); *H03F 3/245* (2013.01);
(Continued)

(58) Field of Classification Search
CPC ........................................................ H04K 1/02

USPC ......................................................... 375/296
See application file for complete search history.

(56) References Cited

U.S. PATENT DOCUMENTS 5,285,505 A 2/1994 Kim et al.
5,490,223 A 2/1996 Nishimura et al.
(Continued)

FOREIGN PATENT DOCUMENTS

EP 391044 10/1990
EP 2530832 12/2012
EP 2779442 9/2014

OTHER PUBLICATIONS

European Search Report for European Patent Application Serial No. 1459434.1 mailed Jun. 6, 2014, 7 pages.
(Continued)

*Primary Examiner* — Tanmay Shah
(74) *Attorney, Agent, or Firm* — Patent Capital Group

(57) ABSTRACT

Digital pre-distortion (DPD) systems are often used to improve the linearity of a power amplifier in transmitters. These DPD systems are typically implemented in baseband (prior to modulation). However, ever increasing signal bandwidth requirements limits the practicality of DPD systems implemented in baseband. A DPD system in the radio frequency (RF) domain (as opposed to in baseband) can solve this problem and further improve a DPD system's ability to correct for distortions. The RF domain DPD system is upstream from a digital-to-analog converter, and performs DPD after a baseband signal is up-sampled into the RF domain (after the modulation process). When compared against a baseband DPD system, the RF domain DPD system can handle significantly wider bandwidth, and has an improved ability to linearize a wide variety of distortions present in the spectrum.

20 Claims, 8 Drawing Sheets

(51) Int. Cl.
| | |
|---|---|
| *H04L 25/49* | (2006.01) |
| *H04B 1/04* | (2006.01) |
| *H03F 1/30* | (2006.01) |
| *H03F 1/32* | (2006.01) |
| *H03F 3/195* | (2006.01) |
| *H03F 3/24* | (2006.01) |
| *H03F 3/45* | (2006.01) |

(52) U.S. Cl.
CPC ..... *H03F 3/45085* (2013.01); *H03F 2200/447* (2013.01); *H03F 2201/3212* (2013.01); *H03F 2201/3233* (2013.01)

(56) References Cited

U.S. PATENT DOCUMENTS

| | | | | |
|---|---|---|---|---|
| 5,647,023 | A | | 7/1997 | Agazzi et al. |
| 6,304,140 | B1 | | 10/2001 | Thron et al. |
| 6,339,399 | B1 | | 1/2002 | Andersson et al. |
| 6,774,683 | B2 | | 8/2004 | Schafferer |
| 6,798,251 | B1 | | 9/2004 | Schafferer |
| 6,973,138 | B1 | | 12/2005 | Wright |
| 7,903,016 | B1 | | 3/2011 | Wyatt |
| 8,009,095 | B2 | | 8/2011 | Schlee et al. |
| 8,284,860 | B2 | | 10/2012 | Xu et al. |
| 8,351,877 | B2 | * | 1/2013 | Kim et al. .................. 455/114.3 |
| 8,417,200 | B1 | | 4/2013 | Gomez et al. |
| 8,548,403 | B2 | | 10/2013 | Kim et al. |
| 8,618,969 | B2 | | 12/2013 | Wyville |
| 8,885,763 | B2 | | 11/2014 | Ananthaswamy |
| 8,948,301 | B2 | | 2/2015 | Rollins |
| 2002/0048326 | A1 | | 4/2002 | Sahlman |
| 2003/0179831 | A1 | * | 9/2003 | Gupta et al. .................. 375/296 |
| 2007/0241812 | A1 | | 10/2007 | Yang et al. |
| 2012/0154038 | A1 | * | 6/2012 | Kim et al. ..................... 330/149 |
| 2013/0285998 | A1 | * | 10/2013 | Hong et al. ................... 345/212 |
| 2014/0362949 | A1 | | 12/2014 | Pratt |
| 2015/0124907 | A1 | * | 5/2015 | Li et al. ........................ 375/320 |

OTHER PUBLICATIONS

U.S. Appl. No. 14/210,304, filed Mar. 14, 2014, 42 pages.
U.S. Appl. No. 14/201,845, filed Mar. 8, 2014, 47 pages.
U.S. Appl. No. 14/222,223, filed Mar. 21, 2014, 52 pages.
Kelly Mekechuk et al., "Linearizing Power Amplifiers Using Digital Predistortion, EDS Tools and Test Hardware", High Frequency Design, Amplifier Linearization, From Apr. 2004 *High Frequency Electronics* © 2004 Summit Technical Media, LLC, 7 pages.
DARPA, Broad Agency Announcement, Direct Digital to High Power Analog Conversion Technology (PowerDAC), DARPA Microsystems Technology Office (MTO), DARPA-BAA-11-12, Jan. 13, 2011, 46 pages.
Response to Extended European Search Report for EP14159434.0 filed Jan. 23, 2015, 15 pages.
Blog, D1 I/V with 4x TDA1543, http://www.diyaudio.com/forums/pass-labs/196937-d1-i-v-4x-tda1543.html, Pass Labs, Sep. 20, 2011, 4 pages.
Blog, The Pass D1 for TDA1543, http://www.diyaudio.com/forums/digital-line-level/32999-pass-d1-tda15 . . . , Digital Line Level, DACs, Digital Crossovers, Equalizers, etc., Apr. 26, 2004, 6 pages.
Office Action in European Patent Application Serial No. EP14159343.1 mailed May 21, 2015, 5 pages.
Adams, R. "A 3V CMOS 400mW 14b 1.4GS/s DAC for Multi-Carrier Applications", Solid-State Circuits Conference, 2004, Digest of Technical Papers, ISSCC, 2004 IEEE International, Feb. 15-19, 2004, vol. 1, pp. 360-532 (172).
AD9734/AD9735/AD9736—Analog Devices Data Sheet—10-/12-/14-Bit, 1200 MSPS DACS, Rev. A, © 2006 Analog Devices, Inc., 72 pages.
Ajay Kuckreja, "Digital RF Modulators for CCAP," Aug. 20, 2012, www.cedmagazine.com/articles/2012/08/digital-rf-modulators-for-ccap, May 7, 2015, 5 pages.
Dong-U Lee et al., "Hierarchical Segmentation for Hardware Function Evaluation," IEEE Transactions on Very Large Scale Integration (VLSI) Systems, vol. 17, No. 1, Jan. 2009, 1063-8210/$25.00 © 2008 IEEE, pp. 103-116 (14 pages).
Tsutomu Sasao et al., "Numerical Function Generators Using LUT Cascades," IEEE Transactions on Computers, vol. 56, No. 6, Jun. 2007, 0018-9340/07/$25.00 © 2007 IEEE, Published by the IEEE Computer Society, pp. 826-838 (14 pages).
Patent Abstracts of Japan, vol. 14, No. 494, Japan (P-1123), Oct. 26, 1990 & JP-A-02-202689 (Fujitsu Ltd) Aug. 10, 1990, abstract, 1 page.
Patent Abstracts of Japan, vol. 15. No. 368 (P1235). Japan Sep. 17, 1991 & .TP-A-O3 144788 (Nee Corp) Jun. 20, 1991, abstract, 1 page.
Response to May 21, 2015 Office Action issued in EP 14159434.1 filed Sep. 21, 2015, 12 pages.

* cited by examiner

US 9,276,617 B2

RADIO FREQUENCY DOMAIN DIGITAL PRE-DISTORTION

PRIORITY DATA

This non-provisional patent application receives benefit from or claims priority to U.S. Provisional Application 61/799,723 entitled "DUTY CYCLE DETECTION CIRCUIT FOR DOUBLE DATA RATE CONVERTER" and filed on Mar. 15, 2013, U.S. Provisional Application 61/787,733 entitled "DIGITAL SWITCHING" and filed on Mar. 15, 2013, U.S. Provisional Application 61/801,549 entitled "RADIO FREQUENCY (RF) DOMAIN DIGITAL PRE-DISTORTION (DPD)" and filed on Mar. 15, 2013, U.S. Provisional Application 61/867,233 entitled "HIGH OUTPUT POWER DIGITAL-TO-ANALOG CONVERTER SYSTEM" and filed Aug. 19, 2013. These referenced patent applications are all hereby incorporated by reference.

TECHNICAL FIELD OF THE DISCLOSURE

The present disclosure relates generally to digital signal processing, in particular, radio frequency domain digital pre-distortion.

BACKGROUND

Transmitters are often used in communications, and one important component is the power amplifier (PA). The PA is configured to amplify weak signals without adding distortion. The PA is usually power hungry, typically consuming 30% (or more) of total power. Furthermore, the PA is expensive, usually making up 30% (or more) of the total cost of a transmitter. One characteristic of a power amplifier is that when the input power is relatively small, the output power is also relatively small. In this operating zone, the PA behaves linearly, but the PA is not very efficient. When the input power is relatively high, the output power is also high. In this operating zone, the PA is very efficient, but the PA loses its linearity. Such non-linearity generates undesirable effects in the signal itself as well as in adjacent channels. To correct for these non-linearities, digital pre-distortion (DPD) systems are often used in the signal chain of a transmitter to improve the quality the output signal of the power amplifier in the transmitter.

Overview

Digital pre-distortion (DPD) systems are often used to improve the linearity of a power amplifier in transmitters. These DPD systems are typically implemented in baseband (prior to modulation). However, ever increasing signal bandwidth requirements limits the practicality of DPD systems implemented in baseband. A DPD system in the radio frequency (RF) domain (as opposed to in baseband) can solve this problem and further improve a DPD system's ability to correct for distortions. The RF domain DPD system is upstream from a digital-to-analog converter, and performs DPD after a baseband signal is up-sampled into the RF domain (after the modulation process). When compared against a baseband DPD system, the RF domain DPD system can handle significantly wider bandwidth, and has an improved ability to linearize a wide variety of distortions present in the spectrum.

DESCRIPTION OF EXAMPLE EMBODIMENTS OF THE DISCLOSURE

Understanding Transmitters and Non-Linearities

In wired and wireless communications, transmitters are ubiquitous in telecommunications technology, as essential electronic devices that transmit an analog output signal over a medium to enable two components to communicate. One or more processors are used to generate a digital signal (e.g., encoding information to be transmitted). The digital signal in baseband, is typically up-converted to the radio frequency (RF) domain, and provided to a digital to analog converter to generate an analog output signal. Before the analog output signal is transmitted, a power amplifier (PA) is usually provided to amplify and increase the power of the analog output signal. Thus, the power amplifier plays a crucial role in the signal chain in a transmitter.

When the PA is operating efficiently, sometimes the power amplifier loses linearity. Components in transmitters are preferably "linear", in that they ought to substantially accurately reproduce the signal present at their input. An amplifier that has non-linearities, i.e., a non-linear input/output relationship, can cause the output signal to be distorted or splatter onto adjacent radio frequencies.

To correct these non-linearities, digital pre-distortion (DPD) systems can be provided in the processor in baseband to insert pre-distortion into the signal being provided to the power amplifier. Traditionally, the pre-distortion inverses the non-linearities present in the power amplifier in order to restore a linear input/output relationship. The pre-distortion mechanism can be provided by modeling the characteristics of the system and generating an appropriate pre-distortion response for a given input signal (and in some cases, past input signals). As a result, the overall system having the DPD mechanism is more linear while being able to operate the power amplifier efficiently.

Generally speaking, linearization is commonly used to undo the distortion caused by non-linear devices. Typically, active linearization techniques, including baseband digital pre-distortion (DPD) or RF pre-distortion (RFPD), allow the transmitter to operate close or even slightly above its peak-to-average ratio (PAR) operating point. The linearizer can be placed before or after the device causing the distortion.

Figure 1:
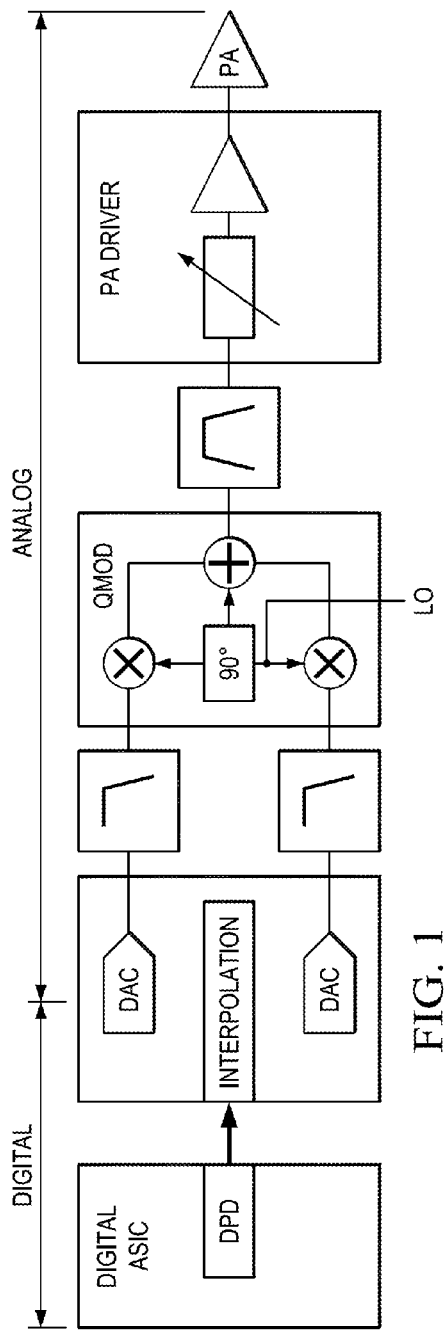
FIG. 1 shows a traditional baseband digital pre-distortion system implemented in a transmitter.

FIG. 1 shows a traditional baseband digital pre-distortion system implemented in a transmitter. The digital signal at baseband is digitally pre-distorted by the DPD module implemented on the Digital Application-Specific Integrated Circuit (ASIC) and interpolated (by Interpolation module) and passed to I and Q digital-to-analog converters (DACs). The DAC outputs are passed to the analog quadrature modulator (QMOD) and modulated to the LO frequency. After that, the signal it is further filtered and amplified by a power amplifier (PA driver+PA).

The baseband DPD is implemented in the digital ASIC at baseband. The trend of ever increasing signal bandwidth limits the usefulness of zero-IF (ZIF) architecture and the baseband DPD. As an example, in the ZIF solution, it can have an example signal bandwidth of 300 MHz and a 5th-order polynomial for the baseband DPD correction. Pre-distorting the example signal using the $5^{th}$ order polynomial DPD would thus increase the bandwidth by about five times. This leads to the effective pre-distorted signal bandwidth of 1.5 GHz. We would therefore need I and Q DACs that can run at 1.5 GHz. The input data rate to I and Q DACs must be more than 3 GSPS. With a 16 bit word for I and Q DAC's, this translates to an interface speed of 16 bits per sample*3 GSPS=48 GBPS. Therefore the data bus from the signal source to the DAC needs to include at least 6 JESD204B interfaces (or some other similar serial data interfaces) for a given implementation.

When the digital filters are used, the filter transition bands needs to be accounted for which requires even higher DAC data rate. The additional factor, e.g., of 1/0.8, may be used to account for the digital interpolation filter transition bands when the system would further interpolate the signal up before sending to the DAC or to create sufficient transition bands for the DAC reconstruction filter and other filters to filter out the image produced by the DAC. With a 16 bit word for the I and Q DAC's, this translates to an interface speed of 16 bits per sample*(1.5/0.8) GSPS*2 DAC's=60 GBPS. This system would need 8 JESD204B interfaces to get the data into the DAC for a given implementation.

Radio Frequency (RF) Domain Digital Pre-Distortion (DPD) System

To sufficiently reduce the interface bandwidth, a radio frequency (RF) domain digital pre-distortion (DPD) system is provided to a transmitter. A RF domain DPD system is not to be confused with a baseband DPD system (or a radio frequency analog pre-distortion (RFDP)) system. The main difference to conventional digital pre-distortion schemes is the implementation of DPD in the RF domain, i.e., after the modulation process of up-sampling the baseband signal into the RF domain, in contrast to the baseband.

While the present disclosure describes the use of the RF domain DPD with a high-speed DAC and PA system, it is appreciated by one skilled in the art that the RF domain DPD is a generic DPD system which can also be applied in other types of systems.

Figure 2:
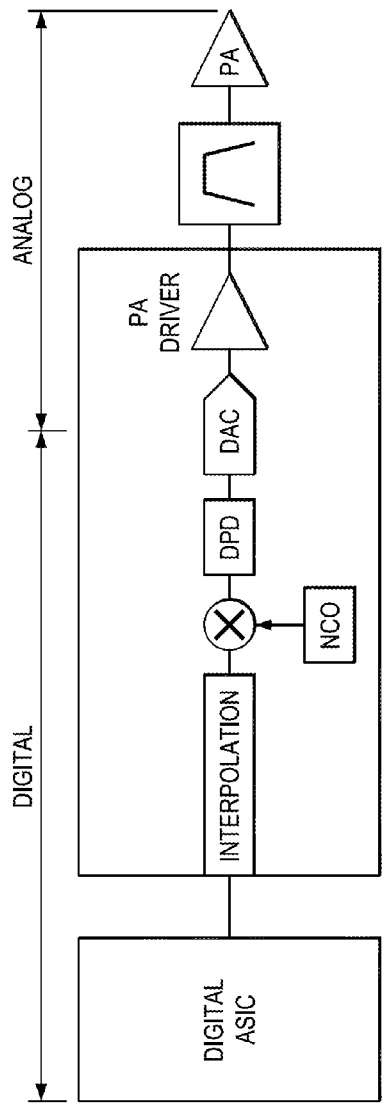
FIG. 2 shows an exemplary transmitter system having a radio frequency domain digital pre-distortion system, according to some embodiments of the disclosure.

FIG. 2 shows an exemplary transmitter system having a radio frequency domain digital pre-distortion system, according to some embodiments of the disclosure. The baseband signal is interpolated and up-converted in a modulation module (e.g., a modulation module including an interpolation module and/or an up-conversion module). The up conversion is done entirely in the digital domain and can take advantage of the advanced technology node, for example, 28 nm process, to reduce the system power consumption. It eliminates the Phase Locked Loop (PLL)/Voltage Control Oscillator (VCO)/modulator out of the signal chain.

After the digital up-conversion stage, the signal from the Digital ASIC (or some other suitable processor, such as a FPGA) goes through the RF domain digital pre-distortion (DPD) system (shown as "DPD" in the figure) to compensate for the non-linearities caused by the system of DAC, power amplifier (PA) driver, and power amplifier (PA) downstream from the RF domain DPD system.

The DPD scheme implemented can be a black-box linearization approach wherein the exact distortion causing mechanism is ignored, and only indirectly measured. Alternatively, it can recognize the specific cause of the distortions based on the circuit topology of the DAC and then can compensate to fix it at the source rather than by targeting specific spurs in the spectrum. Some cases may implement a DPD scheme that includes a hybrid of both approaches.

Figure 3:
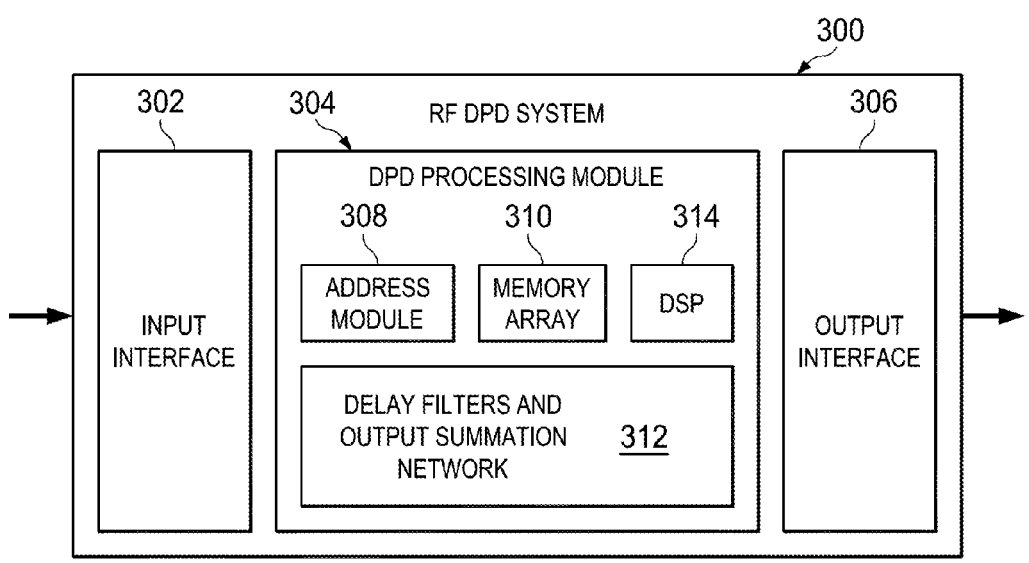
FIG. 3 shows an illustrative radio frequency digital pre-distortion system, according to some embodiments of the disclosure.

Referring back to the previous example of a baseband DPD and consider an example of RF domain DPD. The DAC as seen in FIG. 3 can sample at 12 GSPS in order to get 6 GHz first Nyquist zone. The area is less than half of the area of the ZIF DAC (the two I and Q DACs seen in FIG. 2) since there is only one single DAC (as shown in FIG. 3) that handles the real data instead of two I and Q DACs. The increase on the dynamic power in the RF DAC/DPD system can be addressed in the advanced technology node. For example, in 28 nm process, the power aspect is not dominant anymore. When the pre-distortion would be implemented at the DAC rate, at the input, the data rate is 16 bits*0.6 GSPS=9.6 GSPS. This would require 1 or 2 JESD204B interfaces (or some other suitable serial data interfaces) to get the data into the DAC chip, compared to the 6 lanes of JESD204b interfaces that are used in baseband DPD.

Implementation: State-to-State Finite Non-Linear Response Approach

FIG. 3 shows an illustrative radio frequency digital pre-distortion system, according to some embodiments of the disclosure. The radio frequency (RF) domain digital pre-distortion (DPD) system 300 comprises an input interface 302 for receiving a RF domain digital input signal, wherein the RF domain digital input signal is up-sampled from a baseband signal, a DPD processing module 304 for processing the RF domain digital input signal to generate a pre-distorted digital output signal, wherein the DPD processing module compensates for non-linearities (present in components) downstream from the RF domain DPD system (the DAC and power amplifiers, etc.), and an output interface 306 for providing the pre-distorted digital output signal to a digital-to-analog converter (DAC).

Due to the significant increase in speed, the RF domain DPD system implementation is not trivial. The designs suitable for such kind of DPD system should take into the account of the speed at which the RF domain DPD system is implemented. The DPD processing module may include one or more of the following: an address module 408, a memory array 410 (or some other suitable memory element), delay filters and output summation network 412.

The appropriate pre-distortions can be implemented in different ways. In one situation, a closed-form expression (i.e., a pre-distortion function) can be used to model the system to produce the inverse response of the non-linearity. In another situation, a look-up table can be used for determining the appropriate pre-distortion needed to generate the pre-distorted signal. The DPD processing module may thus include a memory array for storing a look-up table used for generating the pre-distorted signal, and a digital signal processor (DSP) having an adaptation algorithm implemented thereon for updating the look-up table.

The memory array can store the nonlinear response from one DAC code another DAC code, i.e., a state matrix. The state matrix can be extracted through various methods. The size of the state matrix (or depth of the memory array) is set to provide sufficient pre-distortion correction. Before or during the operation, an adaptation algorithm implemented on the DSP can determine or update the values of the state matrix.

In some examples, the state matrix can be the information extracted by comparing a feedback signal and a delayed version of the RF digital input signal (wherein the delay in this case corresponds to the delay incurred through the feedback loop of the original RF digital input signal to the output and the output being fed back to the DPD adaptation algorithm).

In some instances, the memory array may output values of a nonlinear response of a state change, e.g., between the current state and the previous state. One can characterize the DAC current pulses, evaluate the rise time/the fall time/DC charge errors of the actual DAC current pulses compared to the ideal current pulses. The state matrix can be generated based on the charge error information.

The information stored in the memory array is associated with the current state and the past state. Therefore this information is indexed and accessed though both the current and past state. The address module uses at least some bits of the current state and the past state to generate the address for the memory array. The address space is determined to provide adequate memory depth.

The delay filters and output summation network may be configured to sum values from the memory array (and/or derivations of the values from the memory array) and a current state of the RF domain digital input signal to generate the pre-distorted digital output signal. Other suitable mechanisms for generating the pre-distorted signal besides summation can be used (e.g., see FIG. 5).

Figure 4:
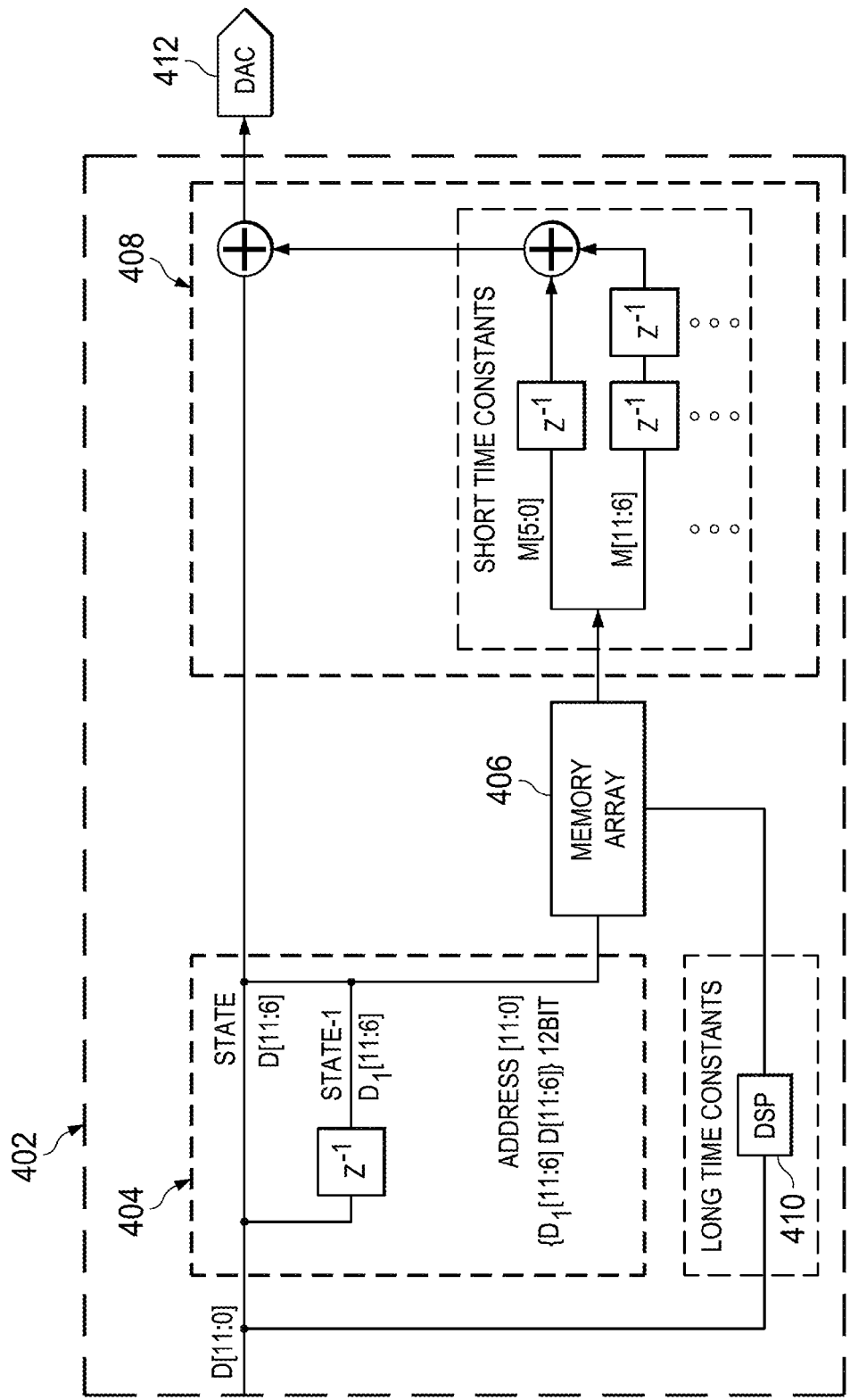
FIG. 4 shows an illustrative implementation of a radio frequency digital pre-distortion system, according to some embodiments of the disclosure.

FIG. 4 shows an illustrative implementation of a radio frequency digital pre-distortion system, according to some embodiments of the disclosure. This FIGURE illustrates a more specific implementation of the RF domain DPD system seen in FIG. 3. The overall DPD processing system 402 includes an input interface for receiving a RF domain digital input signal (e.g., d[11:0]), wherein the RF domain digital input signal is up-sampled from a baseband signal, and an output interface for providing the pre-distorted signal to a DAC 412. The box 404 shown in FIG. 4 corresponds to the address module 308 of FIG. 3. The memory array corresponds to the memory array 310 of FIG. 3. The box 408 corresponds to the delay filters and output summation network 312 of FIG. 3. The DSP 410 corresponds to the DSP 314 of FIG. 3.

The DPD can be implemented in the RF domain after the up conversion using a state to state finite nonlinear response approach, as seen in this FIGURE. A state to state approach determines the appropriate pre-distortion for a current sample of the RF digital input signal based on state transitions between a current state of the RF digital input signal and a past state of the RF digital input signal. This can be implemented using multiple methods, for example, the look up tables stored in the memory array, which can be very efficiently implemented, especially in advanced technology node. This allows RF domain DPD to occur at high speeds.

The address module 404 of this FIGURE uses two states: a current state ("state") and a past state ("state-1") to generate the memory address. The past state ("state-1") can be generated by providing the current state to a delay filter ("$Z^{-1}$"). The memory array (e.g., [11:0]) stores the response corresponding to a state-to-state change (e.g., the nonlinear response between all possible state changes, from each DAC code to every other possible DAC code).

An example is illustrated in the FIGURE wherein the MSB codes are used in the address module 404 to decode the address of the memory array. For instance, the address module 404 comprises the most significant bits (msbs) of the RF domain digital input signal in the current state (e.g., d[11:6]), and the most significant bits (msbs) of the RF domain digital input signal in the previous state (e.g., $d_1$[11:6]). The address word for the memory array is constructed with a concatenation of the msbs of a current state of the RF domain digital input signal and the msbs of a previous state of the RF domain digital input signal. In this example, the implementation utilizes 6 out of 12 bits of the RF digital input signal, other numbers of bits of the RF digital input signal can also be used.

The output of the memory array is the nonlinear response of the state change (i.e., between the current state and the previous state). In this example, the responses, e.g., M[5:0] and M[11:6] for the particular state change, are separated and delayed (using filters depicted "$Z^{-1}$") and then summed together (e.g., using delay filters and the output summation network) to provide a further signal. That further signal may then be summed, by a summation node, with the current state of the RF domain digital input signal to generate the pre-distorted signal.

For instance, the output summation network may comprise one or more delay filters ("$Z^{-1}$") for delaying values from the memory array (M[5:0], M[11:6], etc.) and one or more summation nodes for summing delayed versions of the values from the memory array with a current state of the RF domain digital input signal (d[11:0], or "state") to generate the pre-distorted digital output signal. In this example, M[5:0] is delayed for one time period and M[11:6] is delayed for two time periods prior to being summed by a summation node. Further signal paths having further response values from the memory array and further delays of more time periods of those further response values can be provided for a more complex output summing network.

The separation of the time domain can be advantageously implemented in this example. The non-linearities coming from DAC and PA have different characteristics. Some have an exponential shape, and others can be a rectifying functions or arbitrary shape due to the segmentation mismatch. The short time constants associated with the DAC are generally in the range of a couple of clock cycles and can be implemented with the nonlinear filters at DAC sampling rate. The longer time due to other variations, for example the temperature variation, which could usually be in the range of 100 msec, can be implemented with DSP or ARM which updates the look up table in the non-linear filter, e.g., using an adaptation algorithm.

Variations on Output Combining Network

Figure 5:
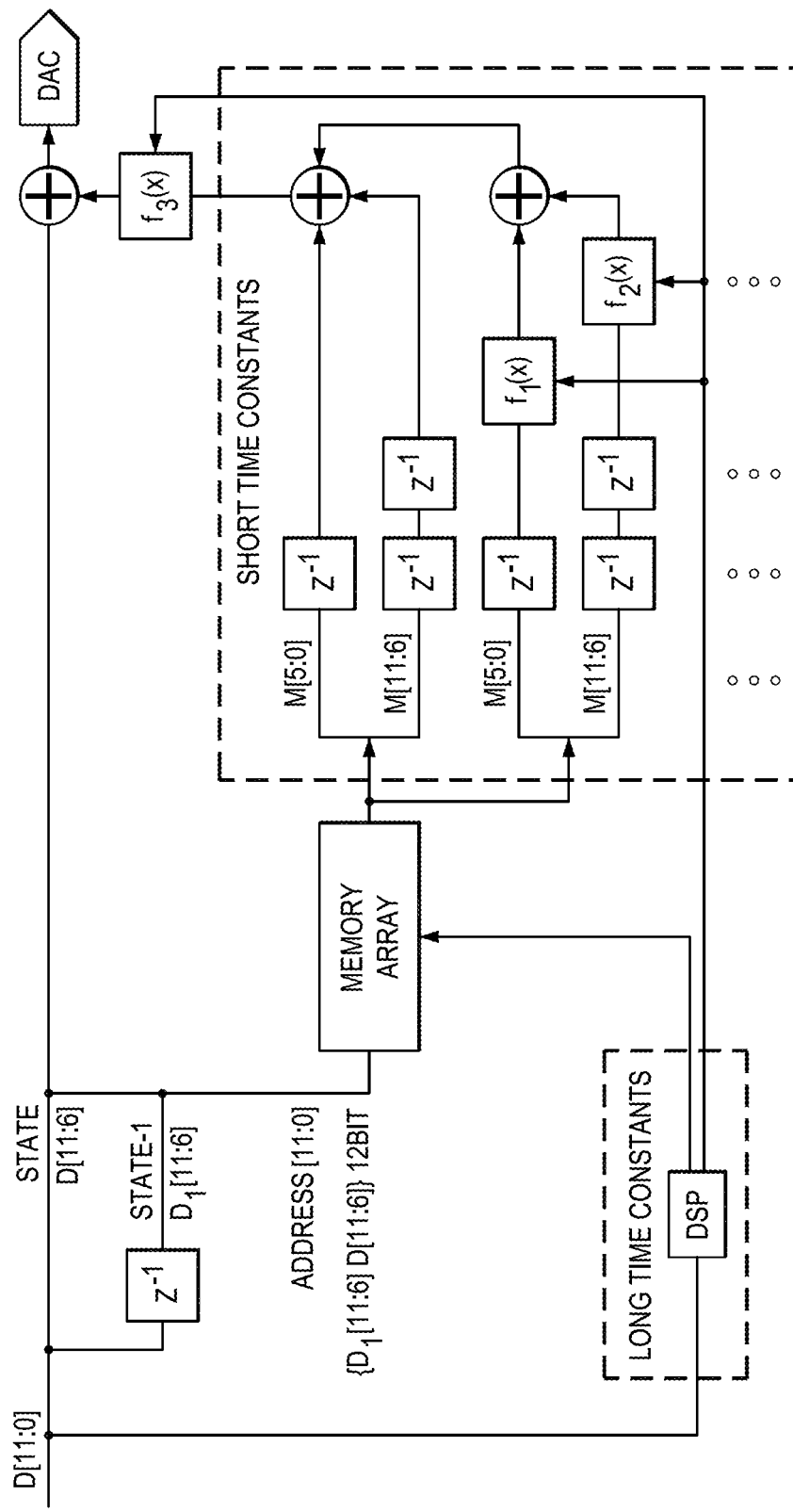
FIG. 5 shows another illustrative implementation of a radio frequency digital pre-distortion system, according to some embodiments of the disclosure.

FIG. 5 shows yet another illustrative implementation of a radio frequency digital pre-distortion system, according to some embodiments of the disclosure. Specifically, FIG. 5 illustrates a variation on the implementation for the output summation network. The variation envisions that the output summation network can be further provided with one or more filters to improve the correction behavior of the DPD processing module and the DPD processing module's ability to restore the ideal response. In particular, the output summation network can include one or more first filters (shown as $f_1(x)$ and $f_2(x)$) for filtering delayed versions of the values from the memory array to generate derivations of the delayed versions of the values from the memory array. Furthermore, the output summation network can include one or more second filters (shown as $f_3(x)$) for filtering the summation of the pre-distortion signals to produce a more precise pre-distortion signal. In the broadest sense, the one or more second filters can filter the summation of one or more of the following: value(s) from the memory array, delayed version(s) of the value(s) from the memory array, derivation(s) of values from the memory array, and derivation(s) of delayed version(s) of the value(s) from the memory array. In this example, the filter $f_3(x)$ filters a summation of: delayed versions of the values from the memory array and derivations of the delayed versions of the values from the memory array (as filtered by the one or more first filters (shown as $f_1(x)$ and $f_2(x)$)).

These filters may provide a polynomial function for filtering a signal, or some other suitable function for filtering the signal. For instance, the filter can be used for reducing noise or some other artifact of the system.

The RF domain DPD system may include a digital signal processor (DSP) having an adaptation algorithm implemented thereon for updating the one or more first filters and/or the one or more second filters.

The output summation network can be implemented with a first summation node for summing the current state of the RF domain digital input signal with a further signal, and a second summation node for providing the further signal, wherein the second summation node sums delayed versions of the values from the memory array and/or derivations of the delayed versions of the values from the memory array.

In this example, the further signal is a summation of the following: M[5:0] (response value corresponding to d[11:6]) delayed for one time period, M[11:6] (response value corresponding to $d_1$[11:6]) delayed for two time periods, M[5:0] delayed for one time period and filtered by $f_1(x)$, and M[11:6] delayed for two time periods and filtered by $f_2(x)$. The summation of these signals is further filtered by $f_3(x)$ to implement more complex functions. Further signal paths having further response values from the memory array and further delays of more time periods of those further response values can be provided for a more complex output summing network.

By using these filters, the DPD processing module can further fine tune the pre-distortion needed to restore linearity or some other ideal property of the components for which the DPD system is designed. For instance, these filters can be provisioned to pre-distort the signal or provide pre-distortion to correct for a specific type of non-linearity or artifact that isn't corrected by the memory array.

Implementation: N-Tap Short Time-Constant Impulse Response (STIR)

Figure 6:
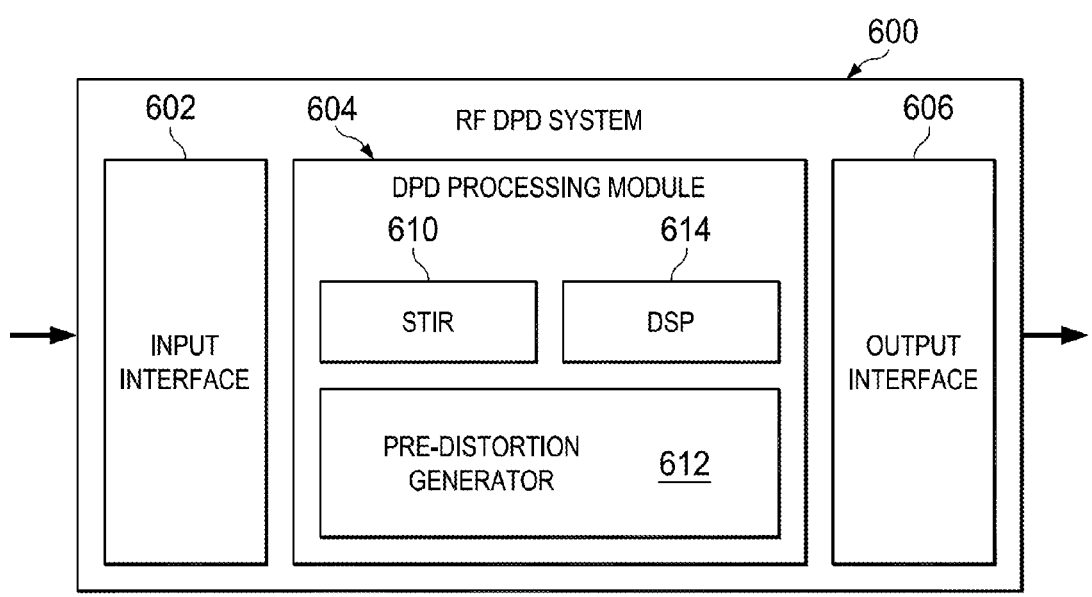
FIG. 6 shows another illustrative a radio frequency digital pre-distortion system, according to some embodiments of the disclosure.

FIG. 6 shows another illustrative a radio frequency digital pre-distortion system, according to some embodiments of the disclosure. The RF DPD system 600, similar to e.g., the RF DPD system seen in FIG. 3, includes an input interface 602 for receiving a RF domain digital input signal, wherein the RF domain digital input signal is up-sampled from a baseband signal, a DPD processing module 604 for processing the RF domain digital input signal to generate a pre-distorted digital output signal, wherein the DPD processing module compensate for non-linearities downstream from the RF domain DPD system, and an output interface 606 for providing the pre-distorted digital output signal to a digital-to-analog converter (DAC). In this example, the DPD processing module includes a Short Time-constant Impulse Responses (STIR) module 610, a pre-distortion generator 612, and a DSP 614.

The STIR module may include a plurality of N-tap Short Time-constant Impulse Responses (STIR) associated with each of a plurality of state transitions (as maintained by states module 608), wherein each state is represented by current samples and past samples or a function of the current samples and the past samples. The pre-distortion generator, based on a latest input sample, a current state and previous states, may be configured to add a length N STIR that spans N DAC clock cycles to an input to the DAC.

The STIR, as maintained in the STIR module 610, may be unique to every combination of state-to-state transition or they may be identical within groups of state-to-state transitions but different between groups. The STIR may be generated by a closed form expression or recalled from memory array having been previously stored in it, or some combination of the two.

The STIR may be estimated by implementing a closed loop system that senses the time domain output and computing the STIR based on the error between data transmitted via the DAC and the received data. The STIR may be estimated by implementing a closed loop system that senses the frequency domain output and computing the STIR based on spurious levels seen in the frequency spectrum of the output of the DAC.

The STIR may be computed to deliver the ideal amount of charge (i.e. the charge delivered by an ideal DAC) on every DAC clock. The STIR may be computed by passing vectors (i.e. a sequence of samples) that are specially tailored to identify the impulse responses. The specially tailored sequence of samples mentioned above may take the form of impulses that take the DAC from one desired start state to another desired end state.

The STIR may be computed and then tracked during regular operation. The STIR may be computed for some state-to-state transitions and those for others may be estimated by interpolating between the previously computed values.

The STIR may be modified/adapted over a much longer time scale (many 100's of DAC clocks) to track variations due to temperature changes. This allows the RF domain DPD to account for long time constants as well as short time constants. This modification/adaptation may be realized by periodically changing the STIR stored in memory, or by changing a parameter to the closed form expression used to compute the STIR and computing the STIR again based on this new temperature-dependent parameter.

Implementation in a Current Steering DAC

Figure 7:
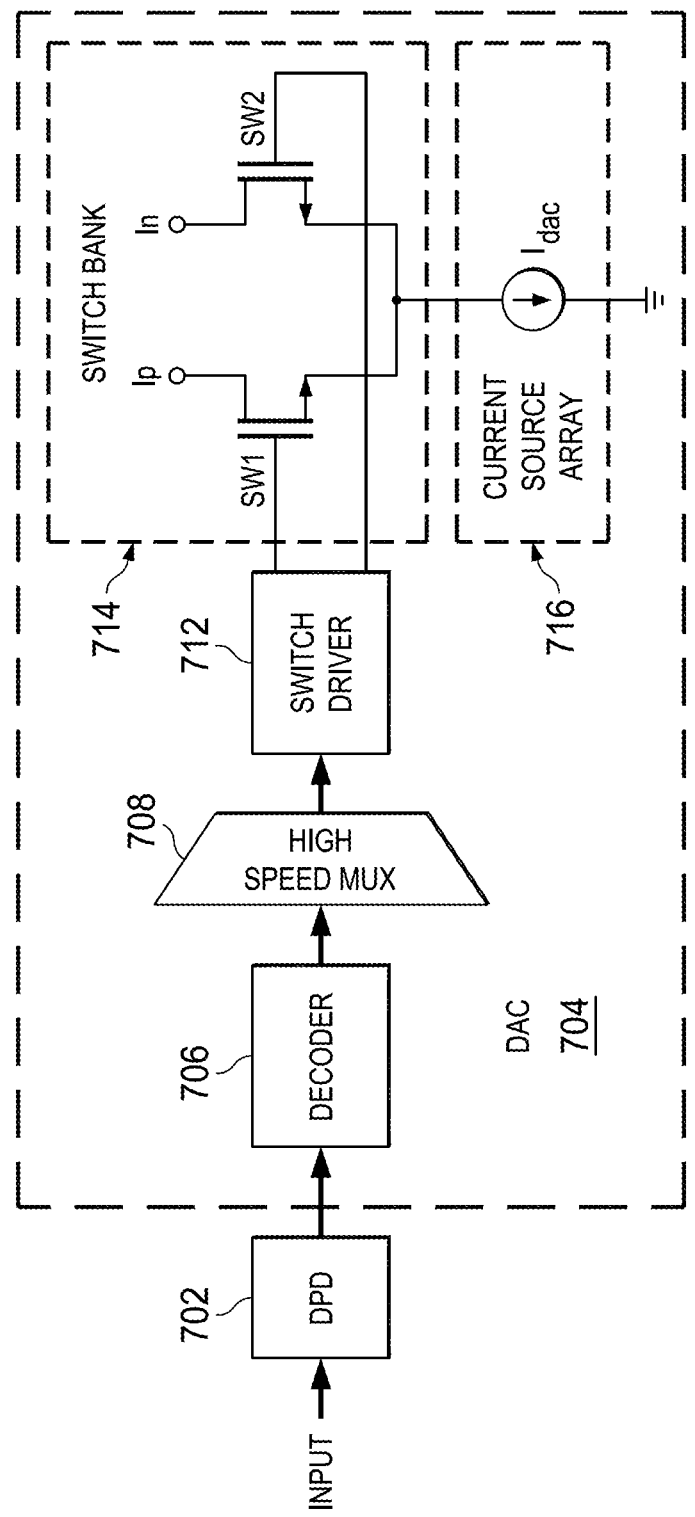
FIG. 7 shows an exemplary block diagram illustrating a possible configuration of a radio frequency (RF) domain digital pre-distortion (DPD) module, according to some embodiments of the disclosure.

FIG. 7 shows an exemplary block diagram illustrating a possible configuration of a radio frequency (RF) domain digital pre-distortion (DPD) module, according to some embodiments of the disclosure. The overall system includes a DPD system 702, and a DAC 704. As described in the present disclosure, the input to the DPD module comes from a modulation module for up-sampling a baseband signal from a digital processor and generating a RF domain digital input signal. The DPD system 702 has an input interface of a DPD system for receiving the RF domain digital input signal, a DPD processing module of the DPD system for processing the RF domain digital input signal to generate a pre-distorted digital output signal, and an output interface of the DPD system for providing the pre-distorted digital output signal to the digital-to-analog converter (DAC). The DAC 704 can convert signals from a digital domain to the analog domain. In this illustration, the DAC 704 includes a decoder 706, a high speed multiplexer 708, a switch driver 712, a switch bank 714, and a current source array 716. Traditionally the frequency domain method is extensively used in the baseband DPD system, in which case the DPD is be performed before the data enters the DAC, i.e., before the DAC decoder 706, as depicted in FIG. 7.

Figure 8:
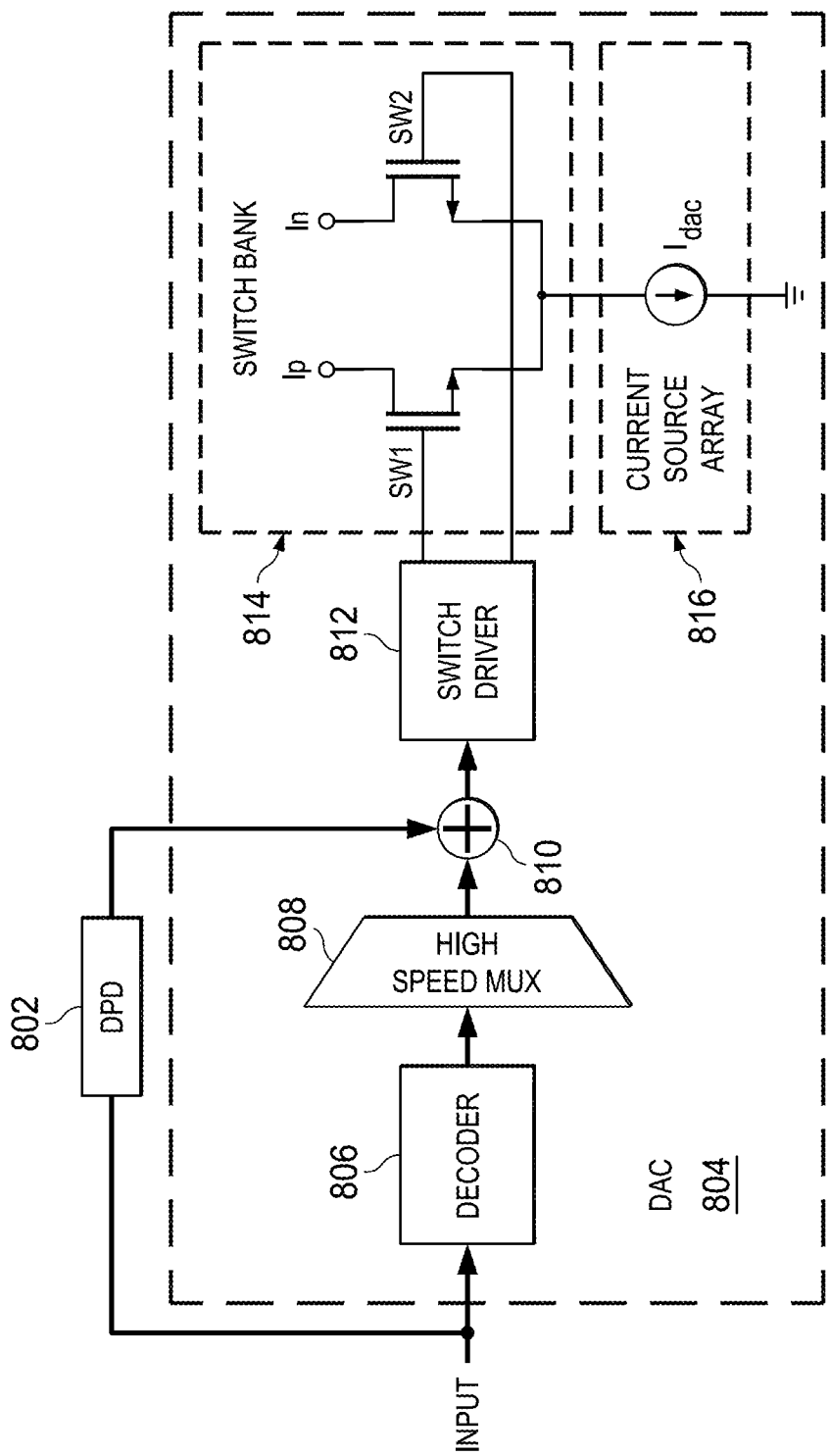
FIG. 8 shows an exemplary block diagram illustrating another possible configuration of a radio frequency (RF) domain digital pre-distortion (DPD) module, according to some embodiments of the disclosure.

FIG. 8 shows an exemplary block diagram illustrating another possible configuration of a radio frequency (RF) domain digital pre-distortion (DPD) module, according to some embodiments of the disclosure. The overall system here also includes a DPD system 802, and a DAC 804. Also as described in the present disclosure, the input to the DPD module comes from a modulation module for up-sampling a baseband signal from a digital processor and generating a RF domain digital input signal. The DPD system 802 has an input interface of a DPD system for receiving the RF domain digital input signal, a DPD processing module of the DPD system for processing the RF domain digital input signal to generate a pre-distorted digital output signal, and an output interface of the DPD system for providing the pre-distorted digital output signal to the digital-to-analog converter (DAC). The DAC 804 can convert signals from a digital domain to the analog domain. In this illustration, the DAC 804 includes a decoder 806, a high speed multiplexer 808, a summation node 810, a switch driver 812, a switch bank 814, and a current source array 816. The proposed RF domain DPD scheme in the present disclosure can take advantage of the time domain method and have significant design flexibility. The DPD correction signal can be fed at a later stage of the DAC, as depicted in FIG. 8, at the summation node 810. The DPD can be implemented in parallel with the DAC decoder 706 and the high speed mux 708. The summation node can sum the output of the high speed mux 708 and the pre-distorted digital output signal from the DPD system. The pre-distortion signal corrects the time domain waveform at the last stage that contains the digital signal and is retimed by analog circuitry, i.e., the switch driver 812, to generate the final input data which will lead to the outputs closer to the ideal waveforms.

Technical Advantages

Figure 9A:
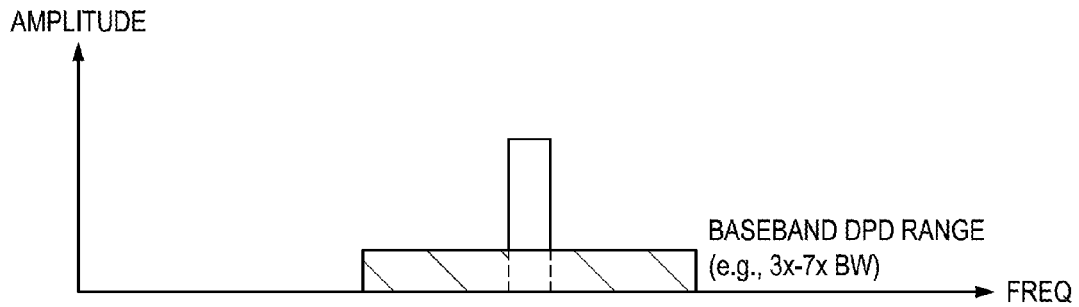
FIG. 9A shows a plot illustrating the output spectrum of a baseband digital pre-distortion system.
Figure 9B:
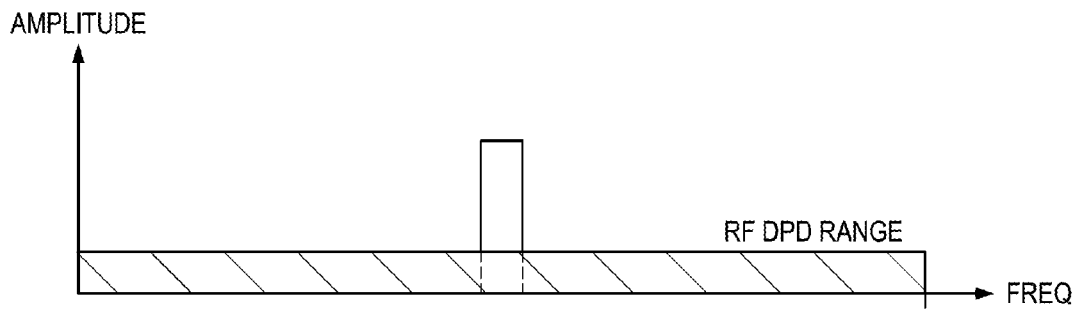
FIG. 9B shows a plot illustrating the output spectrum of a radio frequency digital pre-distortion system, according to some embodiments of the disclosure.

FIG. 9A shows a plot illustrating the output spectrum of a baseband digital pre-distortion system. A narrow band DPD can only handle a small bandwidth (shaded in the FIGURE) around the band of interest. As shown, the baseband DPD range is about 3×-7× of the bandwidth. FIG. 9B shows a plot illustrating the output spectrum of a radio frequency digital pre-distortion system, according to some embodiments of the disclosure. When pre-distortion is done in the radio frequency domain, the Nyquist band (shaded in the FIGURE) extends to half the DAC rate ($f_s/2$, where $f_s$ is the DAC's sampling frequency), which covers a significantly wider bandwidth.

RF domain DPD has the ability to linearize a wide variety of distortions present in the spectrum. The baseband (narrow band DPD) usually only corrects for the symptoms around the band of interest. In many narrow band DPD schemes, different types of distortion usually need to be clearly identified and treated differently in the DPD process. When the DPD is implemented in baseband, it can only handle intermodulation (IMD) distortions since those are the ones that fall within the Nyquist band. The proposed RF domain DPD (broadband DPD) approach actually corrects for the physical deficiencies of the system of DAC and power device and therefore the whole output spectrum will improve. The RF domain DPD can advantageously address various harmonics and distortions.

RF domain DPD does not have the bandwidth expansion that is necessary in the baseband DPD so that it reduces the requirements on the input bandwidth and the up conversion filter. In the baseband PDD, due to the bandwidth expansion, the pre-distorted signal bandwidth increases by about five times (for a fifth order function) and the interpolation filters in the data path of the RF DAC need to have sufficient bandwidth to allow for the increased pre-distorted signal bandwidth. On the contrary, RF domain DPD greatly reduces the requirement on the interface bandwidth. The reduction on the hardware significantly reduces the necessary interface power. The interface pin count is reduced which enables smaller foot print and reduces the complexity of the routing and board design. In addition, the bandwidth of the filters in the up-sampling path for the RF DAC will be also significantly smaller than if the pre-distortion were done at the baseband.

Radio Frequency Domain Digital Pre-Distortion Method

Figure 10:
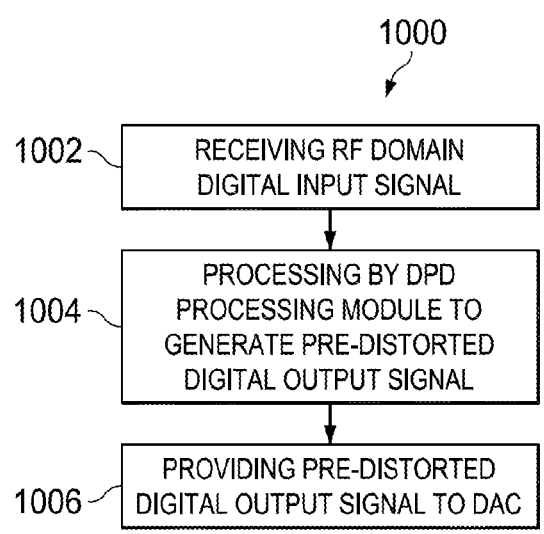
FIG. 10 shows an exemplary flow diagram illustrating a method for radio frequency (RF) domain digital pre-distortion (DPD), according to some embodiments of the disclosure.

FIG. 10 shows an exemplary flow diagram illustrating a method for radio frequency (RF) domain digital pre-distortion (DPD), according to some embodiments of the disclosure. The method 1000 for radio frequency (RF) domain digital pre-distortion (DPD) comprises receiving a RF domain digital input signal through an input interface, wherein the RF domain digital input signal is up-sampled from a baseband signal (box 1002), processing, by a DPD processing module, the RF domain digital input signal to generate a pre-distorted digital output signal, wherein the DPD processing module compensates for non-linearities downstream from the RF domain DPD system (box 1004), and providing, through an output interface, the pre-distorted digital output signal to a digital-to-analog converter (DAC) (box 1006).

The method may further include generating the pre-distorted signal using a look-up table stored on a memory array, and updating the look-up table using a digital signal processor (DSP) having an adaptation algorithm implemented thereon.

In some cases, the method further includes using a concatenation of a current state of the RF domain digital input signal and a previous state of the RF domain digital input signal as an address word for the memory array. This configuration of the memory array allows the current state and the past state to determine the appropriate pre-distortion response.

Furthermore, in some situations, the method further includes using only the most significant bits of the RF domain digital input signal in the current state and using only the most significant bits of the RF domain digital input signal in the previous state to decode the address of the memory array.

Moreover, in some cases, the method further includes obtaining, from the memory array, values of a nonlinear response of a state change between the current state and the previous state, and summing, using an output summation network, values from the look-up table and a current state of the RF domain digital input signal to generate the pre-distorted digital output signal. This illustrates one mechanism for providing the pre-distorted signal. For instance, the method may include delaying, using one or more delay filters of the output summation network, values from the look-up table, and summing, using one or more summation nodes, delayed versions of the values from the look-up table with a current state of the RF domain digital input signal to generate the pre-distorted digital output signal.

Exemplary Implementations and Variations

It is noted that the present disclosure describes a digital pre-distortion system in the radio frequency domain. It is envisioned that the RF domain DPD system configuration can be used with any flavor of DPD systems, including open-loop, closed-loop, and DPD systems implementing various different types of DPD algorithms (static, adaptive, look-up tables, polynomials, feed forward DPD, feedback DPD, etc.).

In the discussions of the embodiments above, any capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital pre-distortion functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to radio frequency wireless communications, wired communications, radar, audio and video equipment, base stations, transmitters, and other digital-processing-based systems which may benefit from a RF domain DPD system.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Note that all optional features of the apparatus described above may also be implemented with respect to the method or process described herein and specifics in the examples may be used anywhere in one or more embodiments.

It is also important to note that the functions/procedures related to digital pre-distortion, such as ones shown in FIG. 8, illustrate only some of the possible digital pre-distortion functions that may be executed by, or within, systems illustrated in FIGS. 3-6. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes, Examples and Implementations

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

EXAMPLES

Example 1 is a radio frequency (RF) domain digital pre-distortion (DPD) system, the system comprising: an input interface for receiving a RF domain digital input signal, wherein the RF domain digital input signal is up-sampled from a baseband signal; a DPD processing module for processing the RF domain digital input signal to generate a pre-distorted digital output signal, wherein the DPD processing module compensates for non-linearities downstream from the RF domain DPD system; and an output interface for providing the pre-distorted digital output signal to a digital-to-analog converter (DAC).

In Example 2, the subject matter of Example 1 can optionally include the DPD processing module having a Nyquist bandwidth up to half the sampling frequency of the DAC.

In Example 3, the subject matter of Example 1 or 2 can optionally include the DPD processing module comprising: a memory array for storing a look-up table used for generating the pre-distorted signal; and a digital signal processor (DSP) having an adaptation algorithm implemented thereon for updating the look-up table.

In Example 4, the subject matter of Example 3, can optionally include an address word for the memory array comprising a concatenation of a current state of the RF domain digital input signal and a previous state of the RF domain digital input signal.

In Example 5, the subject matter of Example 3 or 4 can optionally include an address word for the memory array comprising a concatenation of the most significant bits of a current state of the RF domain digital input signal and the most significant bits of a previous state of the RF domain digital input signal.

In Example 6, the subject matter of any one of Examples 3-5 can optionally include the memory array outputting values of a nonlinear response of a state change between the current state of the RF domain digital input signal and the previous state of the RF domain digital input signal.

In Example 7, the subject matter of any one of Examples 3-6 can optionally include the DPD processing module comprising an output summation network for summing delayed versions of values from the memory array and a current state of the RF domain digital input signal to generate the pre-distorted digital output signal.

In Example 8, the subject matter of Example 7 can optionally include the output summation network comprising one or more delay filters for delaying values from the memory array and one or more summation nodes for summing delayed versions of the values from the memory array with a current state of the RF domain digital input signal to generate the pre-distorted digital output signal.

In Example 9, the subject matter of any one of Examples 7-8 can optionally include the output summation network comprising: one or more first filters for filtering delayed versions of the values from the memory array to generate derivations of the delayed versions of the values from the memory array.

In Example 10, the subject matter of any one of Examples 7-9 can optionally include the output summation network comprising: one or more second filters for filtering the summation of values comprising one or more of the following: value(s) from the memory array, delayed version(s) of the value(s) from the memory array, derivation(s) of values from the memory array, and derivation(s) of delayed version(s) of the value(s) from the memory array.

In Example 11, the subject matter of any one of Examples 9-10 can optionally include a digital signal processor (DSP) having an adaptation algorithm implemented thereon for updating the one or more first filters and/or the one or more second filters.

In Example 12, the subject matter of any one of Examples 7-11 can optionally include the output summation network comprising a first summation node for summing the current state of the RF domain digital input signal with a further signal; and a second summation node for providing the further signal, wherein the second summation node sums delayed versions of the values from the memory array and/or derivations of the delayed versions of the values from the memory array.

In Example 13, the subject matter of any one of examples 1-11 can optionally include the DPD processing module comprising: a plurality of N-tap Short Time-constant Impulse Responses (STIR) associated with each of a plurality of state transitions, wherein each state is represented by current samples and past samples or a function of the current samples and the past samples; and a pre-distortion generator, based on a latest input sample, a current state and previous states, for adding a length N STIR that spans N DAC clock cycles to generate the pre-distorted digital output signal.

Example 14 is a method for radio frequency (RF) domain digital pre-distortion (DPD), the method comprising: receiving a RF domain digital input signal through an input interface, wherein the RF domain digital input signal is up-sampled from a baseband signal; processing, by a DPD processing module, the RF domain digital input signal to generate a pre-distorted digital output signal, wherein the DPD processing module compensates for non-linearities downstream from the RF domain DPD system; and providing, through an output interface, the pre-distorted digital output signal to a digital-to-analog converter (DAC).

In Example 15, the subject matter of Example 14 can optionally include: generating the pre-distorted signal using a look-up table stored on a memory array; and updating the look-up table using a digital signal processor (DSP) having an adaptation algorithm implemented thereon.

In Example 16, the subject matter of Example 15 can optionally include using a concatenation of a current state of the RF domain digital input signal and a previous state of the RF domain digital input signal as an address word for the memory array.

In Example 17, the subject matter of any one of Examples 15-16 can optionally include using a concatenation of the most significant bits of a current state of the RF domain digital input signal and the most significant bits of a previous state of the RF domain digital input signal as an address word for the memory array.

In Example 18, the subject matter of any one of Examples 15-17 can optionally include delaying, using one or more delay filters of the output summation network, values from the memory array; and summing, using one or more summation nodes, delayed versions of the values from the look-up table with a current state of the RF domain digital input signal to generate the pre-distorted digital output signal.

Example 19 is a radio frequency (RF) domain digital pre-distortion (DPD) digital-to-analog converter (DAC), the DAC comprising: an input interface for receiving a RF domain digital input signal, wherein the RF domain digital input signal is up-sampled from a baseband signal; a DPD processing module of the DPD system for processing the RF domain digital input signal to generate a pre-distorted digital output signal; a digital-to-analog converter (DAC) for converting signals from a digital domain to the analog domain; and an output interface of the DPD system for providing the pre-distorted digital output signal to the digital-to-analog converter.

In Example 20, the subject matter of Example 19 can optionally include the DAC comprising: a decoder, and a high speed multiplexer; the DPD processing module being implemented in parallel with the decoder and the high speed multiplexer; and the DAC further comprising a summation node summing the output of the high speed multiplexer and the pre-distorted digital output signal.

In Example 21, the subject matter of Example 19 or 20 can optionally include the DPD processing module comprising an output summation network for summing delayed versions of values from the memory array and a current state of the RF domain digital input signal to generate the pre-distorted digital output signal.

In Example 22, the subject matter of Example 21 can optionally include the output summation network comprising one or more of the following: one or more first filters for filtering delayed versions of the values from the memory array to generate derivations of the delayed versions of the values from the memory array.

In Example 23, the subject matter of any one of Example 21 or 22 can optionally include the output summation network comprising: one or more second filters for filtering the summation of values comprising one or more of the following: value(s) from the memory array, delayed version(s) of the value(s) from the memory array, derivation(s) of values from the memory array, and derivation(s) of delayed version(s) of the value(s) from the memory array.

In Example 24, the subject matter of any one of examples 21-23 can optionally include the output summation network comprising: a first summation node for summing the current state of the RF domain digital input signal with a further signal; a second summation node for providing the further signal, wherein the second summation node sums delayed versions of the values from the memory array and/or derivations of the delayed versions of the values from the memory array.

Example 25 is an apparatus for radio frequency (RF) domain digital pre-distortion (DPD), the apparatus comprising means for performing the method of any one of the Examples 14-18.

What is claimed is:

1. A radio frequency (RF) domain digital pre-distortion (DPD) system, the system comprising:
   an input interface for receiving a RF domain digital input signal;
   a DPD processing module for compensating non-linearities downstream from the RF domain DPD system, the DPD processing module comprising:
      a memory address module for concatenating most significant bits of the RF domain digital input signal and most significant bits of a delayed RF domain digital input signal to generate an address word;
      a memory array addressable by the address word, said memory array outputs values of a non-linear response corresponding to possible state changes of the RF domain digital input signal; and
      an output summation network for processing the RF domain digital input signal to generate a pre-distorted digital output signal based on a non-linear response from the memory array;
   an output interface for providing the pre-distorted digital output signal to a digital-to-analog converter (DAC).

2. The RF domain DPD system of claim 1, wherein the DPD processing module has a Nyquist bandwidth up to half the sampling frequency of the DAC.

3. The RF domain DPD system of claim 1, wherein the DPD processing module comprises:
   a digital signal processor (DSP) having an adaptation algorithm implemented thereon for updating the non-linear responses stored in the memory array.

4. The RF domain DPD system of claim 1, wherein the address word comprising a current state of the RF domain digital input signal and a past state of the RF domain digital input signal, and the memory array receiving the address word outputs a value of a nonlinear response corresponding to the state change between the current state and the past state.

5. The RF domain DPD system of claim 1, wherein the output summation network sums delayed versions of values from the memory array and a current state of the RF domain digital input signal to generate the pre-distorted digital output signal.

6. The RF domain DPD system of claim 5, wherein the output summation network comprises:
   one or more delay filters for delaying values from the memory array and one or more summation nodes for summing delayed versions of the values from the memory array with a current state of the RF domain digital input signal to generate the pre-distorted digital output signal.

7. The RF domain DPD system of claim 5, wherein the output summation network comprises:
   one or more first filters providing a first polynomial function to filter delayed versions of the values from the memory array to generate derivations of the delayed versions of the values from the memory array.

8. The RF domain DPD system of claim 5, wherein the output summation network comprises:
one or more second filters providing a second polynomial function to filter the summation of values comprising one or more of the following: value(s) from the memory array, delayed version(s) of the value(s) from the memory array, derivation(s) of values from the memory array, and derivation(s) of delayed version(s) of the value(s) from the memory array.

9. The RF domain DPD system of claim 8, further comprising:
a digital signal processor (DSP) having an adaptation algorithm implemented thereon for updating the one or more first filters and/or the one or more second filters.

10. The RF domain DPD system of claim 8, wherein the output summation network comprises:
a first summation node for summing the current state of the RF domain digital input signal with a further signal; and
a second summation node for providing the further signal, wherein the second summation node sums delayed versions of the values from the memory array and/or derivations of the delayed versions of the values from the memory array.

11. The RF domain DPD system of claim 1, wherein the DPD processing module comprises:
a plurality of N-tap Short Time-constant Impulse Responses (STIR) associated with each of a plurality of state transitions, wherein each state is represented by current samples and past samples or a function of the current samples and the past samples; and
a pre-distortion generator, based on a latest input sample, a current state and previous states, for adding a length N STIR that spans N DAC clock cycles to generate the pre-distorted digital output signal.

12. A method for radio frequency (RF) domain digital pre-distortion (DPD), the method comprising:
receiving a RF domain digital input signal through an input interface;
generating, by memory address module, an address word for a memory array by concatenating a current state of the RF domain digital input signal and a previous state of the RF domain digital input signal to;
outputting, by the memory array, a value of a non-linear response corresponding to a state change between the current state and the previous state based on the address word;
processing, by a DPD processing module, the RF domain digital input signal based on the value from the memory array to generate a pre-distorted digital output signal; and
providing, through an output interface, the pre-distorted digital output signal to a digital-to-analog converter (DAC).

13. The method of claim 12, further comprising:
updating the values in the memory array using a digital signal processor having an adaptation algorithm implemented thereon.

14. The method of claim 12, further comprising:
delaying, using one or more delay filters of a output summation network, values from the memory array; and
summing, using one or more summation nodes, delayed versions of the values from the look-up table with a current state of the RF domain digital input signal to generate the pre-distorted digital output signal.

15. A radio frequency (RF) domain system, the system comprising:
a RF digital pre-distortion system comprising:
an input interface for receiving a RF domain digital input signal;
a DPD processing module of the DPD system, the DPD processing module comprising:
(1) a memory address module for concatenating most significant bits of the RF domain digital input signal and most significant bits of a delayed RF domain digital input signal to generate an address word;
(2) a memory array addressable by the address word, said memory array outputs values of a non-linear response corresponding to possible state changes of the RF domain digital input signal; and
(3) an output summation network for processing the RF domain digital input signal to generate a pre-distorted digital output signal based on a non-linear response from the memory array; and
an output interface of the DPD system for providing the pre-distorted digital output signal to a RF digital-to-analog converter (DAC); and
the RF DAC for converting signals from a digital domain to the analog domain.

16. The RF domain system of claim 15, wherein:
the RF DAC comprises: a decoder, and a high speed multiplexer;
the DPD processing module is implemented in parallel with the decoder and the high speed multiplexer; and
the DAC further comprises a summation node summing the output of the high speed multiplexer and the pre-distorted digital output signal.

17. The RF domain system of claim 15, wherein:
the RF DAC comprises a decoder, a multiplexer, a switch driver, a switch bank, and a current source array.

18. The RF domain system of claim 17, wherein:
the pre-distorted digital output signal is fed to a summation node at the input of the switch driver.

19. The RF domain system of claim 18, wherein:
the pre-distorted signal corrects a time domain waveform that includes the RF domain digital input signal; and
the pre-distorted signal is retimed by analog circuitry comprising the switch driver.

20. The RF domain system of claim 18, wherein the output summation network comprises:
one or more first filters providing a first polynomial function to filter delayed versions of the values from the memory array to generate derivations of the delayed versions of the values from the memory array.

* * * * *